United States Patent

[11] 3,619,740

[72] Inventors Sho Nakanuma; Yuichi Haneta; Toshio Wada, all of Tokyo, Japan

[21] Appl. No. 871,826
[22] Filed Oct. 28, 1969
[45] Patented Nov. 9, 1971
[73] Assignee Nippon Electric Company, Limited Tokyo, Japan
[32] Priority Oct. 29, 1968
[33] Japan
[31] 43/79173

[54] INTEGRATED CIRCUIT HAVING COMPLEMENTARY FIELD EFFECT TRANSISTORS
5 Claims, 6 Drawing Figs.

[52] U.S. Cl. .......... 317/235 R, 317/235 (21) B, 317/235 (22.2) G, 317/235 (48.1) AM, 317/235 (48.5) AS
[51] Int. Cl. .......... H01l 19/00
[50] Field of Search .......... 317/235 (21), 235 (21.1), 235 (22.2); 307/304

[56] References Cited

UNITED STATES PATENTS

| | | | |
|---|---|---|---|
| 3,275,908 | 9/1966 | Grosvalet .......... | 317/235 |
| 3,414,782 | 12/1968 | Lin et al. .......... | 317/235 |
| 3,453,504 | 7/1969 | Compton et al. .......... | 317/235 |

*Primary Examiner*—Jerry D. Craig
*Attorney*—Sandoe, Hopgood and Calimafde

ABSTRACT: An integrated circuit is disclosed in which the drain and source regions of an integrated gate-type field-effect transistor and the gate region of a junction-type field-effect transistor are formed in common within a semiconductor layer of one conductivity type formed on a substrate of the opposite conductivity type.

PATENTED NOV 9 1971 3,619,740

*INVENTORS*
SHO NAKANUMA
YUICHI HANETA
TOSHIO WADA by

Sandoe, Hopgood & Calimafde
ATTORNEYS

INTEGRATED CIRCUIT HAVING COMPLEMENTARY FIELD EFFECT TRANSISTORS

This invention relates to an integrated circuit structure of complementary field-effect semiconductor devices in which a P-channel field-effect transistor and an N-channel field-effect transistor are incorporated into a common semiconductor substrate.

In a conventional integrated circuit of the type having a field-effect transistor with complementary connection, a reverse conductivity type diffusion region having a suitable resistance is partially formed within a semiconductor substrate of one conductivity type, and an insulated gate field-effect transistor (hereinafter referred to as IGFET) whose conduction channels are different from each other, is formed in the diffusion region and in the original semiconductor substrate, respectively. In the conventional integrated circuit associated with the complementary IGFET, silicon dioxide obtained by thermal oxidation of the base silicon is used for the gate insulated film. The IGFET'S are operated in the depletion mode and enhancement mode respectively, by the influence of the mobile ions contained in the gate insulator film. Therefore, the conventional complementary circuit tends to cause distortion in the output of each of the transistors and a corresponding reduction in the useful operating range. Furthermore, it is difficult to manufacture such complementary FET circuit structure in view of the required forming of the high-resistivity diffusion region.

It is an object of the invention to provide an economical complementary field effect semiconductor device in which the electrical symmetry is desirable and which exhibits high performance characteristics over a wide operating range.

In the semiconductor integrated circuit of this invention, an IGFET and a junction-type field-effect transistor (hereinafter referred to as PN-FET are incorporated into a common semiconductor substrate of one conductivity type.

More specifically, N-type diffusion regions which are to serve as the drain and source regions of the IGFET, and as the gate region of the PN-FET are formed in, for example, an P-type semiconductor material whereby the N-channel IGFET and the P-channel PN-FET are formed into an integrated circuit. An insulating material, such as a silicon dioxide film, in which positive charge is stored, is them formed to serve as the insulated gate of the IGFET. By the formation of a surface inversion layer, it is possible to operate both the FET's in the depletion mode wherein current is caused to flow between the drain and source regions at zero bias. When an insulating material such as aluminum oxide, in which negative charge is stored, is used as the insulating film, it is possible to obtain a P-channel IGFET as well as a N-channel PN-FET. If necessary, it is possible to couple the enhancement-type IGFET with the PN-FET.

To the accomplishment of the above and to such other objects as may hereinafter appear, the present invention relates to an integrated circuit having complementary field-effect transistors as defined in the appended claims and as described in the following specification, taken in conjunction with the accompanying drawings, in which:

Figure 2C:
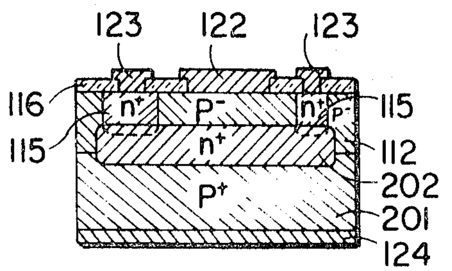
FIG. 2(A) is a plan view of a second embodiment of the invention.
Figures 2A, 2B, 3:
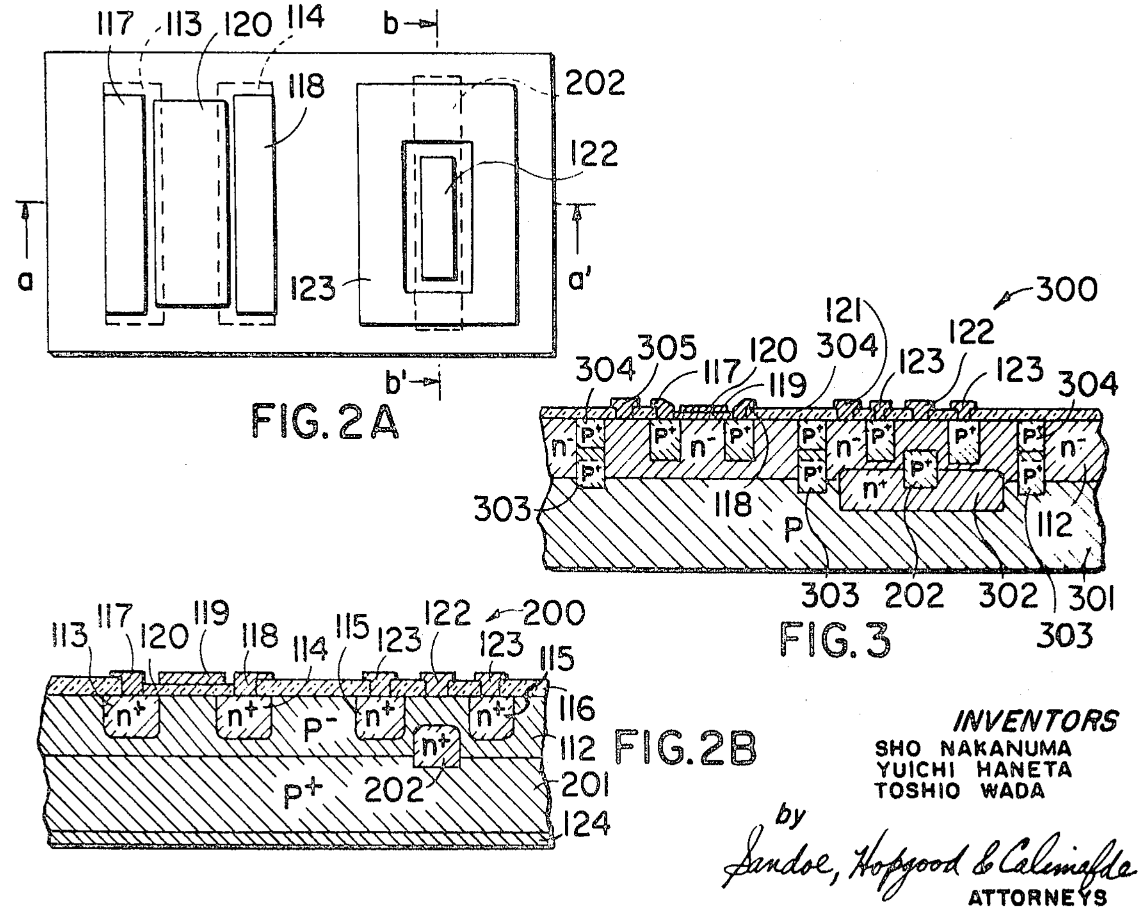

FIGS. 2(B) and 2(C) are respectively plan views and sectional views taken across the lines a—a' and b—b' of FIG. 2(A); and FIG. 3 is a sectional view of a third embodiment of the invention.

Figure 1A:
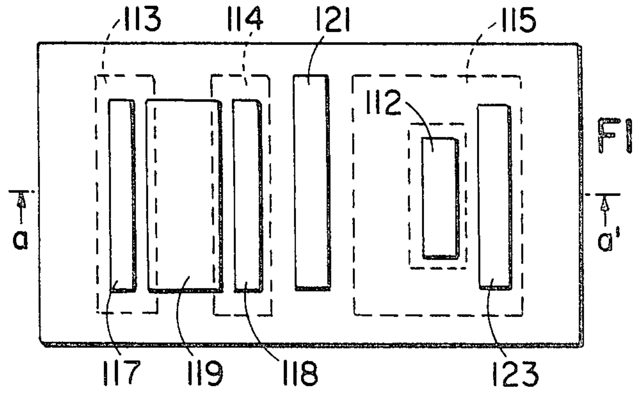
FIG. 1(A) is a plan view of a first embodiment of the invention.
Figure 1B:
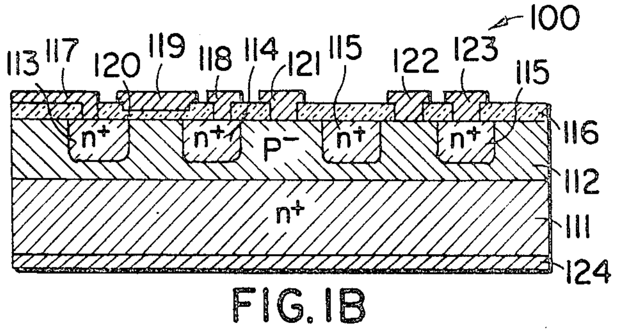
FIG. 1(B) is a sectional view taken along the line of FIG. 1(A)

FIGS. 1(A) and 1(B) illustrate a semiconductor device according to a first embodiment of the invention. That semiconductor device generally designed 100 is formed by growing a P-type silicon epitaxial layer 112 of approximately 8 $\mu$ in thickness and 8 ohm-cm. in resistivity on the surface of an N-type silicon single crystal substrate 111 of approximately 0.01 ohm-cm. in resistivity. Phosphorus diffusion is then applied to P-type layer 112, whereby N-type diffusion regions 113, 114 and 115 of $10^{19}$ atoms/cm.$^3$ in the surface are formed therein to the P-N junction depth of approximately 6 $\mu$, from the top surface of the epitaxial layer 112. Necessary metallic electrodes are then led out through a silicon dioxide film 116 on the surface of the epitaxial layer 112. The N-type diffusion region 113 represents the drain, N-type diffusion region 114 the source of an IGFET, and the region 115 represents the gate of a PN-FET. The metallic electrode consists of a drain electrode 117, a source electrode 118 and a gate electrode 119 of the IGFET, which are bonded thereto by a thin gate film 120 of silicon dioxide, and a source electrode 121, drain electrode 122, and a gate electrode 123 of the PN-FET. The source electrode 121 of the PN-FET serves also as the substrate gate electrode of the IGFET. A metallic electrode 124 disposed on the bottom surface of the substrate 111 defines a base gate electrode by which the substrate 111 is used as the substrate gate of the PN-FET.

In the above-described PN-FET the desired mutual conductance of the FET and the desired allowable current flowing between the drain and source regions is obtained depending on the width and length of the channel. It is known that the pinch-off voltage value and mutual conductance of the IGFET and the PN-FET are largely dependent upon the thickness of the channel and the crystal plane of the surface of the epitaxial layer 112 covered with the silicon dioxide film 116. In, the above embodiment, the crystal plane of the surface of the epitaxial layer is arranged to be (511) so as to symmetrically approximate the electrical characteristics of the P-channel PN-FET to those of the N-channel IGFET.

The complementary field-effect transistor of FIG. 1, having desirable symmetry and conduction channels which are different from each other, can be easily formed in an epitaxial layer of one conductivity type through only a single diffusion process.

FIGS. 2(A)–2(C) illustrate a second embodiment of the invention, in which a semiconductor device generally designated 200 is formed by preliminarily diffusing phosphorus of $10^{20}$ atoms/cm.$^3$ surface impurity density into a P-type semiconductor substrate 201 of less than 0.1 ohm-cm. in resistivity. A P-type epitaxial layer 112 is then formed on the substrate, and high-density N-type diffusion regions 113, 114 and 115 are disposed in layer 112 in the same manner as in the first-described embodiment. A buried layer 202 is formed through the diffusion of N-type impurities into the epitaxial layer 112 from the diffused substrate 201, and a narrow P-type channel is then formed between the N-type diffusion regions 115. The N-type buried layer 202 is operated as the base gate region. The end portions of buried layer 202 extend over and beyond or overlap the N-type diffusion regions 115 as shown in FIG. 2(C) to allow for electrical conduction. The P-N junction formed by autodoping from the buried layer 202 into the overlying epitaxial layer 112 is formed at a depth of about 4 microns measured from the boundary face between the epitaxial layer 112 and the substrate 201. Accordingly, the length of the channel of the PN-FET, which is nearly perpendicular to the surface between the diffusion region 115 and the buried layer 202 in the epitaxial layer 112, is about 2 microns.

The PN-FET obtainable according to this second embodiment makes very high mutual conductance available because, in comparison with the PN-FET of the first-described embodiment, the channel length can be accurately controlled regardless of the accuracy of the diffusion mask.

FIG. 3 shows a semiconductor device according to a third embodiment of the invention, in which a semiconductor device 300 is formed in which a buried N-type layer 302, obtained by the diffusion of a high density N-type impurity such as antimony of a small diffusion coefficient, is formed in the vicinity of the boundary between a P-type semiconductor substrate 301 and an N-type epitaxial layer 112. A buried layer 202, which is formed by the diffusion of a high-density P-type impurity such as boron of a high-diffusion coefficient, is disposed in buried layer 302, and a P-type buried layer 303, which is to serve as the insulation region, is provided in substrate 301 and epitaxial layer 112. A P-type impurity is diffused into buried layer 303 from the top surface of the epitaxial layer 112 whereby an insulated diffusion region 304 is formed which overlaps the buried layer 303. Each of the FET's is thus P-N-junction-insulated by the insulated diffusion region 304. According to this embodiment, the P-channel IGFET is operated in the depletion mode Aluminum oxide may be suitably used for the insulated gate film 120. The source electrode 121 of the N-channel PN-FET and the base gate electrode 305 of the IGFET are not conductively connected but are separately led out therefrom.

According to this third embodiment, the parasitic resistance between the source and drain regions is reduced by the reverse conductivity-type buried layer 302 which isolates the base gate regions 303 and 304 formed during the diffusion process necessary for each FET. Therefore the embodiment of FIG. 3, is very useful with respect to its operating characteristics and reliability of production. Moreover, according to the embodiment of FIG. 3, an integrated circuit comprising bipolar transistors, diodes, resistors, etc. can be easily realized.

In the above-described embodiments, another gate insulator film such as silicon nitride may be substituted for the silicon dioxide and phosphosilicate glass; zinc oxide and zirconium oxide may be substituted for aluminum oxide.

Thus, while only several embodiments of the present invention have been herein specifically disclosed, it will be apparent that variations may be made therein without departure from the spirit and scope of the invention.

We claim:

1. An integrated circuit device comprising a semiconductor substrate of a first conductivity-type, an epitaxial layer of a second, opposite conductivity type formed on said substrate, a diffused drain and source regions of said first conductivity type of an insulated gate-type field-effect transistor formed in said epitaxial layer and spaced by a region of said epitaxial layer, an insulation film formed on the surface of said epitaxial layer and extending over said epitaxial layer region between said source and drain regions and a metal gate on said film, a diffused gate region of said first conductivity type of a juntion-type field-effect transistor also formed in said epitaxial layer, and ohmic contacts on the areas of said epitaxial layer on either side of said gate region defining the source and drain of said junction-type field-effect transistor.

2. The device of claim 1, further comprising a buried layer of said second conductivity type formed in the boundary of said epitaxial layer and said semiconductor substrate, and extending beyond the ends of said gate region.

3. The device of claim 2, further comprising a second buried layer of said first conductivity type formed in said first-mentioned buried layer.

4. The device of claim 3, further comprising a third buried layer of said first conductivity type also formed in the boundary between said epitaxial layer and said substrate.

5. The device of claim 4 further comprising an insulated diffused region of said first conductivity type formed in said epitaxial layer and overlapping said third buried layer.

* * * * *